United States Patent
Katoch et al.

(10) Patent No.: US 10,770,122 B2
(45) Date of Patent: Sep. 8, 2020

(54) MEMORY INPUT HOLD TIME ADJUSTMENT

(71) Applicant: Taiwan Semiconductor Manufacturing Company, Ltd., Hsinchu (TW)

(72) Inventors: Atul Katoch, Hsinchu (TW); Sanjeev Kumar Jain, Hsinchu (TW); Marcin Dziok, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/287,463

(22) Filed: Feb. 27, 2019

(65) Prior Publication Data

US 2020/0043534 A1     Feb. 6, 2020

Related U.S. Application Data

(60) Provisional application No. 62/712,275, filed on Jul. 31, 2018.

(51) Int. Cl.
*G11C 7/22* (2006.01)
*G11C 11/419* (2006.01)

(52) U.S. Cl.
CPC ............ *G11C 7/222* (2013.01); *G11C 11/419* (2013.01)

(58) Field of Classification Search
CPC ..... G11C 7/222; G11C 11/419; H04L 7/0037; H04L 7/0041
See application file for complete search history.

(56) References Cited

U.S. PATENT DOCUMENTS

| | | | |
|---|---|---|---|
| 2014/0241465 A1* | 8/2014 | Itoigawa | H04L 25/0272 375/316 |
| 2018/0122486 A1* | 5/2018 | Choi | G11C 7/222 |
| 2018/0196464 A1* | 7/2018 | Kim | G06F 1/12 |

* cited by examiner

*Primary Examiner* — David Lam
(74) *Attorney, Agent, or Firm* — Merchant Gould P.C.

(57) ABSTRACT

A device for providing gated data signals includes a delay path configured to receive an input signal and output the input signal that is delayed from the input signal by a time interval; a gating signal generator configured to supply a gating signal; a gating circuit configured to receive the data signal from the delay path at the data input, receive the gating signal at the gating input, and output at the data output an output signal indicative of the received data signal when the gating signal is present at the gating input; and a delay controller configured to receive a variable delay control signal and set the delay time interval according to the delay control signal.

20 Claims, 6 Drawing Sheets

MEMORY INPUT HOLD TIME ADJUSTMENT

BACKGROUND

This disclosure relates generally to timed input and output operations and circuits in electronics circuits. This disclosure more specifically relates to memory read and write method and apparatus with improved performance and reliability.

Certain timed input and output operations, such as input (READ) and output (WRITE) operations for memory devices, involve supplying an input or output signal and gating the signal. The relative timing between the input or output signal and the gating signal can significantly, or even critically, affect the performance of the devices. Efforts continue in improving reliability and performance of timed input and output operations in memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
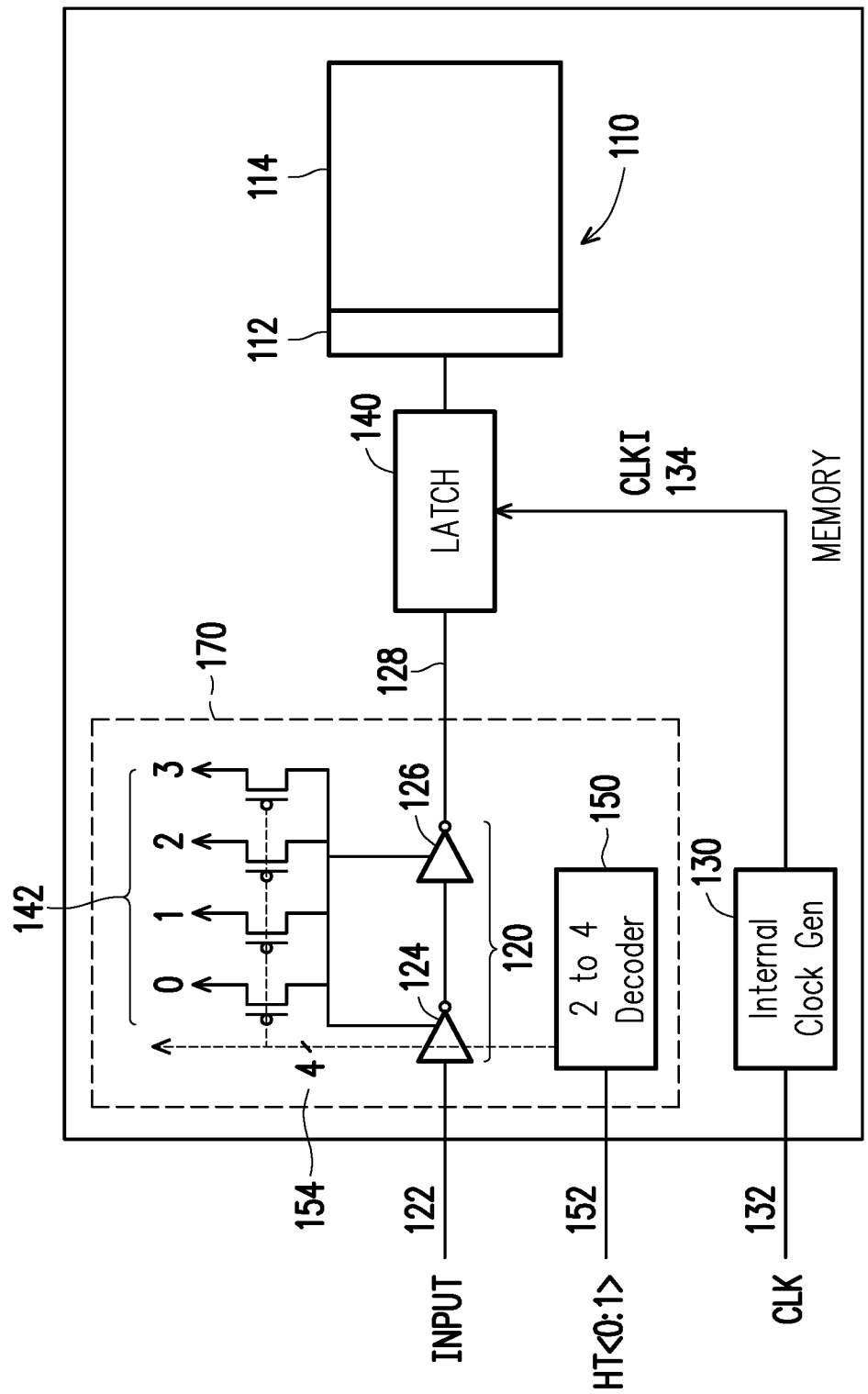
FIG. 1A shows a schematic circuit diagram of a memory device with adjustable input delay in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure pertains to devices and methods employing timed input and output operations. Certain embodiments specifically pertains to the timed input and output operations for memory devices, such as static random access memory (SRAM) cells, dynamic random access memory (DRAM) cells or any other type of memory devices.

With reference to FIG. 1, according to an embodiment, an electronic device, such as a memory device (100), such as an SRAM chip, includes at least a data receiving element, such as a memory cell module (110), which in certain examples includes a peripheral module (112), such as a decoder, and memory cells; an input line (120) for receiving input data (122) in a WRITE operation; an output line (not shown) for supplying output data in a READ operation; an internal clock generator (or gating signal generator) (130), which receives an external (e.g., system) clock signal ("CLK," 132) and generates an internal clock signal ("CLKI," 134) specifically adapted for a gating circuit. The internal clock signal 134 can be of any rate and pulse width suitable for the operation of the gating circuit. The gating circuit can be a gated latch (140), such as a latched D-latch. In this example, the input line (120) includes one or more buffers, in this example two buffers (124, 126) connected in series. The input line (120) receives input (122) and passes it on to the input of the latch (140) after a delay introduced by the buffers (124, 126). The input line (120) thus provides a delay path. The output of the internal clock generator (130) is connected to the enable input of the latch (140) so that the CLKI signal (134) gates the input signal.

For reliable and fast input operation, proper relative timing between the input signal to the latch (140) and the gating (CLKI) signal (134) should be maintained. Generally, an input signal to be written to the memory needs to persist for a minimum period of time, sometimes referred to as "hold time," after the gating signal (134) is turned ON, to ensure the proper writing to the memory. Insufficient or otherwise incorrect hold time (sometimes referred to as "hold time violations") may result in poor performance or even failure of the memory device, and in increased cost and effort in debugging the device. With the increasing density of memory (and corresponding shrinkage in the size of memory devices), the inherent variability of the semiconductor manufacturing processes (sometimes referred to as "on-chip variation" ("OCV") has an increasingly significant impact on signal timing. This leads to an increased probability of hold time violation.

The device (100) in the embodiment shown in FIG. 1A includes a hold time trimming (or tuning) circuit (170), or delay controller, configured to adjust the hold time by varying the amount of delay to the input signal (122) relative to the gating signal (134) to achieve a proper hold time. The hold time trimming circuit (170) in this example includes a number of switching transistors (142), which in this case include four transistors (142-0, 142-1, 142-2, 142-3); and a decoder (150), which in this case is a 2-to-4 decoder, which outputs a four-bit trimming signal (154) to selectively turn the transistors (142-0, 142-1, 142-2, 142-3) on or off, depending on a hold time trimming input signal ("HT")

(152). Any number of transistors and corresponding decoder can be used to trim the hold time.

Figure 1B:
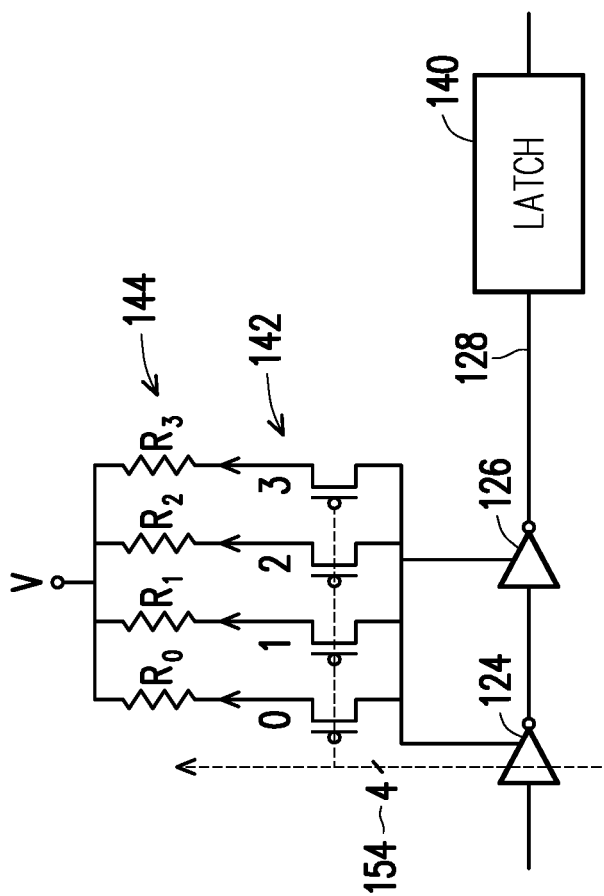
FIG. 1B shows a portion of the device depicted in FIG. 1A and a power source connected to that portion in accordance with some embodiments.

The transistors (142-0, 142-1, 142-2, 142-3) can be of any suitable type, such as field-effect transistors (FETs), and in this example have respective ones of their current-carrying terminals (e.g., drains or sources of FETs) connected to each other and to the power supply terminal of the buffers (124, 126). Turning on each transistor (142-0, 142-1, 142-2, or 142-3) in this case alters the power (voltage or current) supplied to the buffers (124, 126). For example, as shown in FIG. 1B, the other current carrying terminal of each of the transistors (142-0, 142-1, 142-2, 142-3) can be connected to one electrode of a resistor $R_0$, $R_1$, $R_2$, or $R_3$ (144-0, 144-1, 144-2, 144-3, respectively); each resistor can have a resistance that is different from the others. The other ends of the resistors can be connected together and to a voltage supply (V). Selectively turning on one of the transistors by the decoder (150) thus connects the corresponding resistor between the voltage supply and the buffers (124, 126) and has the effect of supplying different voltages to the buffers (124, 126).

In an alternative example, the other current-carrying terminals (e.g., sources or drains) of the transistors (142-0, 142-1, 142-2, 142-3) can each be connected to one end of a respective resistor (not shown), with the other ends of the resistors connected together and to a voltage supply. In this example, the decoder (150) is not used; each of the resistors (142-0, 142-1, 142-2, 142-3) can be selectively turned on or off independent of the state of the other transistors. The pattern of the state of the transistors (142-0, 142-1, 142-2, 142-3) can be, for example, 0000, 0001, 0011, 0111 and 1111, with a "1" indicating the corresponding transistor "on" and "0" indicating "off." Thus, the transistors that are turned on connect the respective resistors in parallel. Turning on any one of the transistors (142-0, 142-1, 142-2, 142-3) therefore has the effect of reducing the overall resistance between the voltage supply to the buffers (124, 126) and increasing the supply voltage to the buffers (124, 126).

The delay time of a buffer in this case is commonly a function of its supply voltage (or current). For example, the delay time of a buffer can increase with a decrease in supply voltage. Selectively turning the transistors (142-0, 142-1, 142-2, 142-3) on and off therefore changes the total delay of the input signal 122, thereby changing the hold time.

The hold time trimming circuit is made as a part of the memory chip in the embodiments discussed above, but can be a separate circuit external to a memory chip as well.

Figure 2:
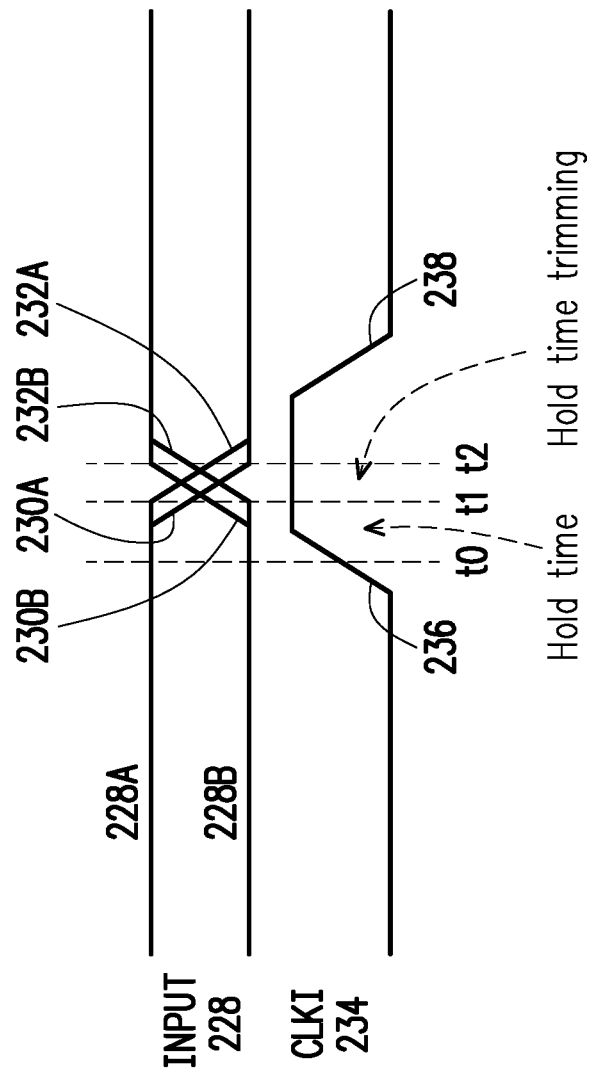
FIG. 2 shows a timing diagram of the input and clock signals for memory devices in accordance with some embodiments.

With reference to FIG. 2, an input signal (228) (input signal (128) in FIG. 1A) to the latch (140) is the result of the time delay of the input signal (122) by the buffers (124, 126). The input signal (228) can be either high (228A) or low (228B). The high signal (228A) can become low through a transition, which can be tuned by a circuit, such as the ones discussed above with reference to FIG. 1A, to occur at an appropriate time. For example, a transition (230A) can be selected to occur at an earlier time, $t_1$; alternatively a transition (232A) can be selected to occur at a later time, $t_2$. Likewise, the low signal (228B) can become high through a transition, which can be tuned by a circuit such as the ones discussed above to occur at an appropriate time. For example, a transition (230B) can be selected to occur at an earlier time, $t_1$; alternatively a transition (232B) can be selected to occur at a later time, $t_2$.

The internal clock signal, or gating signal (134) enables the latch (140) at a first transition (236) at time $t_0$, which in this particular example is a transition from low to high but can be from high to low depending on the circuit design. The latch (140) is later disabled at a second transition (238). The hold time is the period between the first clock transition time $t_0$ and input signal transition time ($t_1$ or $t_2$ in this example), i.e., ($t_1-t_0$) or ($t_2-t_0$), over which interval the input is stable.

Thus, the hold time can be adjusted, or trimmed, to ensure the reliable input operations. Similar schemes can be applied to output operations, if desired. Hold time trimming can be performed at any time. In particular, it can be performed after the manufacturing of a memory chip by a proper setting of the HT input 152. The hold time can be adjusted manually or automatically according to any suitable procedure. For example, hold time can be ramped up (or down) until certain performance parameters of the memory chip are satisfactory (or fail). Alternatively, the actual hold time can be measured and adjusted until it is of a predetermined value.

Because the hold time can be easily adjusted according to embodiments disclosed herein, hold time violations can be easily detected and eliminated, making debugging memory chips a more efficient process. Furthermore, in cases where the cycle time is such that data is present on the data line significantly longer the minimum setup time (the minimum amount of time before the clock's active edge that the data must be stable for it to be latched correctly), hold time trimming can be done without adversely affecting the cycle time, or frequency.

Figure 3:
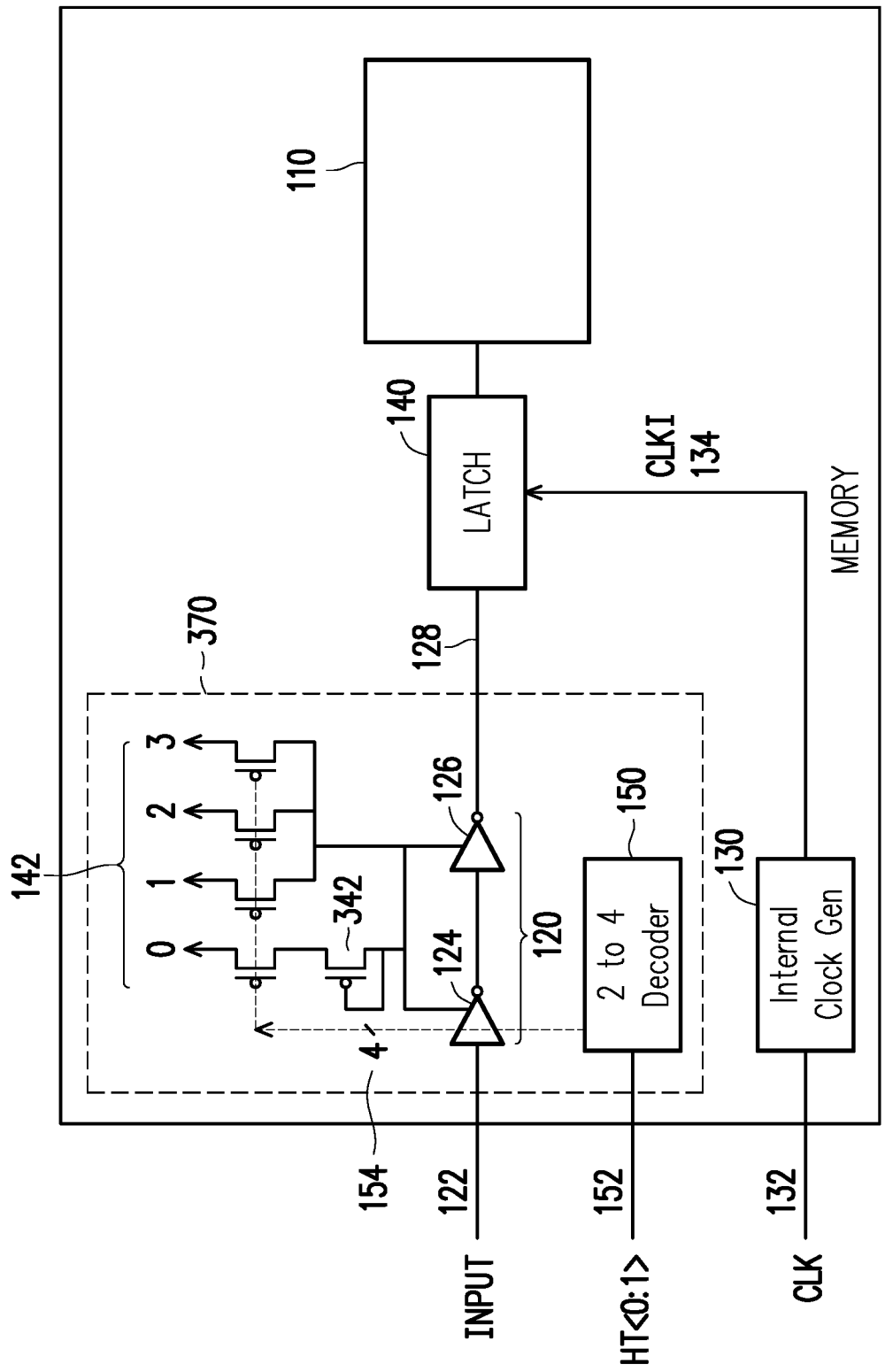
FIG. 3 shows a schematic circuit diagram of another memory device with adjustable input delay in accordance with some embodiments.

With reference to FIG. 3, in an alternative embodiment, the hold time trimming circuit (370) in a memory device (300) is similar to the one in the memory device (100) in FIG. 1A, except that an additional ability to reduce the power (in this case voltage) supplied to the buffers (124, 126) is achieved by adding a diode 342 in series with the source-drain path of at least one transistor, in this example transistor 142-0. In this example, the diode (342) is a diode-connected FET with its gate tied to the drain (or source). The diode 342 introduces an additional voltage drop to that of the transistor 142-0. Other types of components, such as resistors, can be used in place of the diode (342). In both examples, the reduction in power supplied to the buffers (124,126) as a result of the inserted component (diode or resistor) increases the hold time delay by the buffers (124,126).

Figure 4:
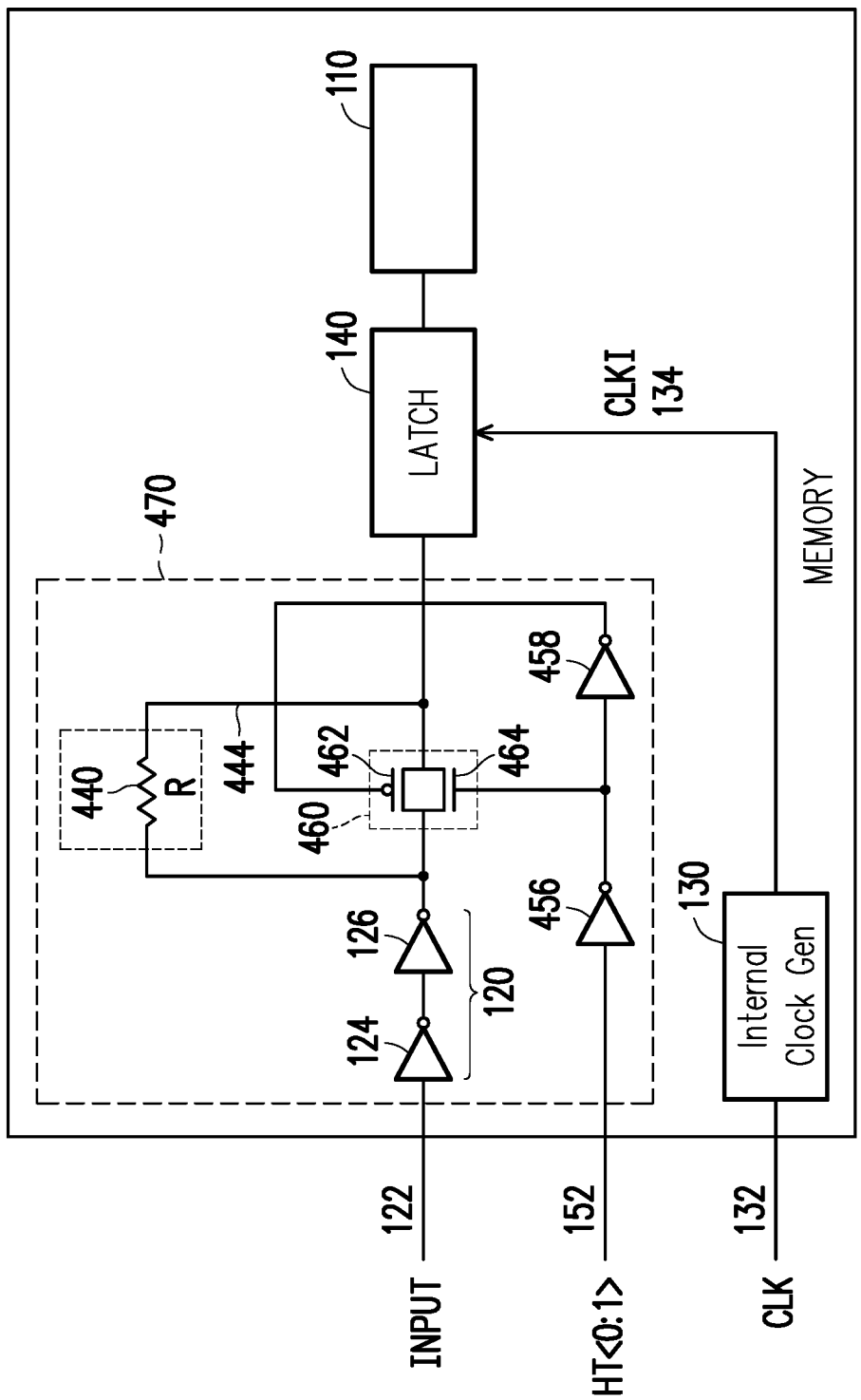
FIG. 4 shows a schematic circuit diagram of a further memory device with adjustable input delay in accordance with some embodiments.

With reference to FIG. 4, in a further embodiment, the hold time trimming circuit (470) in a memory device (400) is accomplished by switching in and out an additional delay element (440) in series (in this case after) with the buffers (124, 126). The delay element (440) can be a resistive element (or more generally an element with an impedance). In this particular example, the delay element (440) is simply a portion of a high-resistivity layer, such as a polysilicon layer in the memory chip. The portion of a high-resistivity layer is connected in series with the buffers (124, 126) by conductive lines (442, 446). A pair (460) of complementary transistors (462, 464) are connected to each other with the corresponding current-carrying electrodes (e.g., sources and drains, respectively, of FETs) pairwise connected to each other, and connected in parallel with the delay element (440). The parallel combination of the resistor pair (460) and delay element (440) in this example thus forms a portion with a variable impedance. A hold time trimming signal (HT) at the hold time signal input 152 is fed to a buffer (456), which is in turn connected in series with another buffer (458). The gate of the transistor (462) is connected to the output of the buffer (458); the gate of the transistor (464) is connected to the junction between the buffers (456, 458).

In operation, for this particular example, when the hold time trimming signal (HT) is low, the transistors (462, 464) become conducting, effectively short-circuiting the delay element (440). As a result, no delay beyond that is provided by the buffers (124, 126) is introduced. When the hold time trimming signal (HT) is high, the transistors (462, 464) become non-conducting, effectively placing the delay element (440) in series with the buffers (124, 126). As a result, an additional delay beyond that is provided by the buffers (124, 126) is introduced. Thus, by changing the hold time trimming signal (HT) level, the delay of the input signal (122) and, in turn, the hold time, can be adjusted. In other examples, additional delay element(s), such as one or more additional portions of polysilicon layer(s) may be added in series with the delay element (440), together with one or more additional HT lines and corresponding buffers similar to the buffers (456, 458). In other alternative examples, the transistor pair (460) can be replaced with a single switching transistor or other suitable switching devices.

Figure 5:
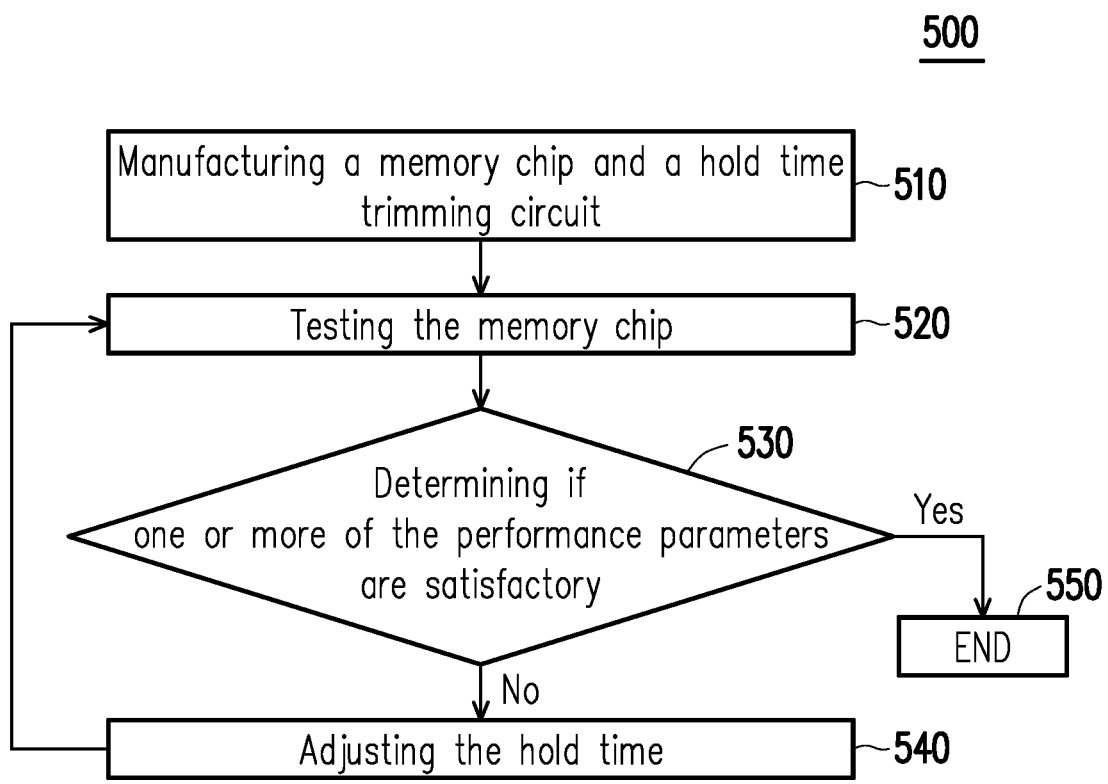
FIG. 5 outlines a method of supplying an input signal to a memory device in accordance with some embodiments.

In other example embodiments, such as the one shown in FIG. 5, in a process (500) of improving performance of timed data input or output operation, an electronic device (such as a memory chip) for performing timed input or output operations is manufactured (150). The device is tested (520) to determine if one or more of the performance (530) parameters (such as hold time, data rate or data error rate) are satisfactory (i.e., meet certain predetermined criteria, e.g., as compared to one or more respective predetermined values). In some embodiments, such parameters are chosen at least in part because they are known, or suspected, to be affected at least in part by hold time. If the test result is unsatisfactory, a data input (or output) hold time is adjusted (540). The adjustment (trimming) (540) of hold time can be performed using any of the hold time trimming circuits (170, 370, 470) described above in connection with FIGS. 1, 3 and 4, respectively, or equivalents thereof. Thereafter, the testing step (520) is repeated. If the test result is satisfactory, the process (500) is concluded (550).

Not all steps described are necessary. For example, a process that includes steps (520) through (550) is sufficient as a complete process if the device is already manufactured, i.e., step (510) has already been performed, for example by a separate entity from the one carrying out steps (520) through (550).

Other embodiments are possible. For example, a diode similar to the diode (342) can be added to any one of the transistors (142-0, 142-1, 142-2, 142-3). In other examples, features of the circuits shown in FIG. 1A or 3, in which the delay(s) in delay elements can be adjusted, can be combined with those of the circuit shown in FIG. 4, in which additional delay element(s) can by switched in or out (shorted). Thus, for example, the circuit portion including the delay element (440), buffers (456, 458) and transistors (462, 464) in FIG. 4 can be connected in series with the buffers (124, 126) anywhere along the data input line between the data input (122) and the latch (140) in the circuit in FIG. 3.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for providing gated data signals, the device comprising:
   a delay path configured to receive an input signal and output a data signal indicative of the input signal and delayed from the input signal by a time interval;
   a gating signal generator configured to supply a gating signal;
   a gating circuit having a data input operatively connected to the delay path, a data output, and a gating input operatively connected to the gating signal generator, the gating circuit being configured to receive the data signal from the delay path at the data input, receive the gating signal at the gating input, and output at the data output an output signal indicative of the received data signal when the gating signal is present at the gating input; and
   a delay controller configured to receive a variable delay control signal and set the delay time interval according to the delay control signal, wherein the delay path comprises a delay element powered by a power supply and having a delay time that is dependent at least in part on the power applied to the delay element, and wherein delay controller is configured to vary the power applied to the delay element.

2. The device of claim 1, wherein the delay element comprises a buffer.

3. The device of claim 2, wherein the delay controller comprises a plurality of electronic switches configured to establish one or more respective paths for supplying power to the buffer.

4. The device of claim 3, wherein the delay controller further comprises a selection module configured to selectively cause one or more of the plurality of electronic switches to conduct dependent on the delay control signal.

5. The device of claim 1, wherein the delay path further includes a portion with a variable impedance, and wherein the delay controller is configured to vary the impedance of delay path portion.

6. The device of claim 1, wherein the memory cell module, the delay path and the delay controller reside in the same memory chip.

7. A device for providing gated data signals, the device comprising:
   a delay path configured to receive an input signal and output a data signal indicative of the input signal and delayed from the input signal by a time interval;
   a gating signal generator configured to supply a gating signal;
   a gating circuit having a data input operatively connected to the delay path, a data output, and a gating input operatively connected to the gating signal generator, the gating circuit being configured to receive the data signal from the delay path at the data input, receive the gating signal at the gating input, and output at the data output an output signal indicative of the received data signal when the gating signal is present at the gating input; and
   a delay controller configured to receive a variable delay control signal and set the delay time interval according to the delay control signal, wherein the delay path includes a portion with a variable impedance, and wherein the delay controller is configured to vary the impedance of delay path portion.

8. The device of claim 7, wherein the variable impedance portion of the delay path comprises a resistive portion and an electronic switch connected to the resistive portion in parallel, and wherein the delay controller is configured to open and close the electronic switch in the delay path according to the delay control signal.

9. The device of claim 8, wherein the resistive portion comprises a portion of a high resistivity layer in an integrated circuit.

10. The device of claim 7, wherein the memory cell module, the delay path and the delay controller reside in the same memory chip.

11. A memory device, comprising:
a memory cell module;
a delay path configured to receive an input signal and output a data signal indicative of the input signal and delayed from the input signal by a delay time interval;
a gating signal generator configured to supply a gating signal;
a gating circuit configured to receive the data signal from the delay path, receive the gating signal, and output to the memory cell module the received data signal upon receiving the gating signal; and
a delay controller configured to vary the delay time interval according to an input to the delay controller, wherein:
the gating signal generator comprises a clock pulse generator, and the gating signal comprises a clock pulse generated by the clock pulse generator;
the gating module comprises a gated latch; and
the delay path comprises a delay element powered by a power supply and having a delay time that is dependent at least in part on the power applied to the delay element, and the delay controller is configured to vary the power applied to the delay element.

12. The memory device of claim 11, wherein the delay element comprises a buffer powered by a power supply and having a delay dependent on a level of power applied to the buffer by the power supply.

13. The memory device of claim 12, wherein the delay controller comprises a plurality of electronic switches, each of which is configured and connected to, when conductive, establish a respective path for applying power to the buffer, each path configured to apply a respective amount of power, and wherein the delay controller is configured to selectively cause one or more of the electronic switches to conduct.

14. A memory device, comprising:
a memory cell module;
a delay path configured to receive an input signal and output a data signal indicative of the input signal and delayed from the input signal by a delay time interval;
a gating signal generator configured to supply a gating signal;
a gating circuit configured to receive the data signal from the delay path, receive the gating signal, and output to the memory cell module the received data signal upon receiving the gating signal; and a delay controller configured to vary the delay time interval according to an input to the delay controller, wherein:
the gating signal generator comprises a clock pulse generator, and the gating signal comprises clock pulses generated by the clock pulse generator;
the gating module comprises a gated latch; and
the delay path includes a portion with a variable impedance, and the delay controller is configured to vary the impedance of delay path portion.

15. The memory device of claim 14, wherein the variable impedance portion of the delay path comprises a resistive portion and an electronic switch connected to the resistive portion in parallel, and wherein the delay controller is configured to open and close the electronic switch in the delay path according to the delay control signal.

16. The device of claim 15, wherein the resistive portion comprises a portion of a high resistivity layer in an integrated circuit.

17. A process of writing data to a memory cell, the method comprising:
transmitting a data signal through an input line;
applying a gating pulse to enable a write operation inputting the transmitted data signal into a memory device;
determining whether a performance parameter of the write operation or a length of time after an onset of the gating pulse during which length of time the transmitted data signal is stable meets one or more predetermined criteria; and
adjusting a time interval by which the data signal is delayed by the input line till the performance parameter or length of time meets one or more predetermined criteria.

18. The process of claim 17, wherein the transmitting step comprises transmitting the data signal through one or more delay elements, and the adjusting the time interval by which the data signal is delayed by the input line comprises adjusting power supplied to at least one of the one or more delay elements.

19. The process of claim 18, wherein the adjusting power supplied to at least one of the one or more delay elements comprises selectively adding one or more conductive paths, each with a respective impedance, between each of the one or more delay elements and a power supply.

20. The process of claim 17, wherein the transmitting step comprises transmitting the data signal through one or more delay elements, and the adjusting the time interval by which the data signal is delayed by the input line comprises changing the number of the one or more delay elements the data signal is transmitted through.

* * * * *

UNITED STATES PATENT AND TRADEMARK OFFICE
CERTIFICATE OF CORRECTION

PATENT NO. : 10,770,122 B2  
APPLICATION NO. : 16/287463  
DATED : September 8, 2020  
INVENTOR(S) : Katoch et al.

Page 1 of 1

It is certified that error appears in the above-identified patent and that said Letters Patent is hereby corrected as shown below:

On the Title Page

Item (74) Attorney, Agent, or Firm: "Merchant Gould P.C." should read --Merchant & Gould P.C.--

In the Specification

Column 5, Line 49: "can by switched in or out" should read --can be switched in or out--

Signed and Sealed this  
First Day of December, 2020

Andrei Iancu  
*Director of the United States Patent and Trademark Office*